(12) United States Patent
Chae (10) Patent No.: US 10,490,253 B2
(45) Date of Patent: Nov. 26, 2019

(54) SEMICONDUCTOR SYSTEM AND SEMICONDUCTOR DEVICE

(71) Applicant: SK hynix Inc., Icheon-si Gyeonggi-do (KR)

(72) Inventor: Haengseon Chae, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/129,442

(22) Filed: Sep. 12, 2018

(65) Prior Publication Data

US 2019/0311764 A1 Oct. 10, 2019

(30) Foreign Application Priority Data

Apr. 10, 2018 (KR) .................. 10-2018-0041459

(51) Int. Cl.
| | |
|---|---|
| *G11C 11/34* | (2006.01) |
| *G11C 11/406* | (2006.01) |
| *G11C 11/4093* | (2006.01) |
| *G11C 11/4096* | (2006.01) |
| *G11C 7/10* | (2006.01) |

(52) U.S. Cl.
CPC ........ *G11C 11/40626* (2013.01); *G11C 7/106* (2013.01); *G11C 7/1063* (2013.01); *G11C 7/1066* (2013.01); *G11C 11/4093* (2013.01); *G11C 11/4096* (2013.01); *G11C 11/40615* (2013.01)

(58) Field of Classification Search
CPC . G11C 11/40626; G11C 7/106; G11C 7/1063; G11C 7/1066; G11C 11/40615; G11C 11/4093; G11C 11/4096
USPC ....................................... 365/174
See application file for complete search history.

(56) References Cited

U.S. PATENT DOCUMENTS

| | | | |
|---|---|---|---|
| 8,325,537 B2 | 12/2012 | Shimizu et al. | |
| 2015/0330845 A1 | 11/2015 | Furutani | |
| 2018/0061474 A1* | 3/2018 | Choi ..................... | G06F 3/0619 |

FOREIGN PATENT DOCUMENTS

KR 1020160121204 A 10/2016

* cited by examiner

*Primary Examiner* — Huan Hoang
(74) *Attorney, Agent, or Firm* — William Park & Associates Ltd.

(57) ABSTRACT

A semiconductor system may include a controller and a semiconductor device. The controller may be configured to output a command. The semiconductor device may be configured to receive and decode the command and generate an internal command to perform a preset operation. The semiconductor device may be configured to update a synchronization temperature code with a temperature code when the temperature code changes. The semiconductor device may be configured to apply the synchronization temperature code to the controller in synchronization with the internal command.

25 Claims, 12 Drawing Sheets

SEMICONDUCTOR SYSTEM AND SEMICONDUCTOR DEVICE

CROSS-REFERENCE TO RELATED APPLICATION

The present application claims priority under 35 U.S.C. § 119(a) to Korean Patent Application No. 10-2018-0041459 filed on Apr. 10, 2018 in the Korean Intellectual Property Office, which is incorporated herein by reference in its entirety.

BACKGROUND

1. Technical Field

Embodiments of the present disclosure generally relate to a semiconductor system and, more particularly, to a semiconductor system including a semiconductor device relating to the output of a temperature code.

2. Related Art

A semiconductor device such as a DRAM uses a TCSR (temperature-compensated self-refresh) circuit to reduce current consumption. The TCSR circuit is a circuit which changes a self-refresh cycle depending on a temperature in self-refresh and thereby reduces current consumption. That is to say, through using the data retention time of the DRAM, the TCSR circuit increases current consumption by shortening a self-refresh cycle when a temperature is high, and reduces current consumption by lengthening a self-refresh cycle when a temperature is low.

In a digital TCSR circuit among TCSR circuits, a digital thermometer is built in a semiconductor device, and a self-refresh cycle is determined by coding a temperature code generated from the digital thermometer. The performance of the digital thermometer is determined by how much a temperature code outputted matches the internal temperature of the semiconductor device.

SUMMARY

In an embodiment, a semiconductor system may include a controller and a semiconductor device. The controller may be configured to output a command. The semiconductor device may be configured to receive and decode the command and generate an internal command to perform a preset operation. The semiconductor device may be configured to update a synchronization temperature code with a temperature code when the temperature code changes. The semiconductor device may be configured to apply the synchronization temperature code to the controller in synchronization with the internal command.

In an embodiment, a semiconductor system may include a controller, a semiconductor device, and a temperature sensor. The semiconductor device may be configured to update a synchronization temperature code with a temperature code when the temperature code changes. The semiconductor device may be configured to apply the synchronization temperature code to the controller in synchronization with an internal command. The temperature sensor may be configured to generate the temperature code which corresponds to a temperature of a region around the semiconductor device.

In an embodiment, a semiconductor device may include an update pulse generation circuit, a command latch signal generation circuit, an update latch signal generation circuit, and a temperature code output circuit. The update pulse generation circuit may be configured to generate an update pulse when a temperature code changes. The command latch signal generation circuit may be configured to generate a command latch signal from the temperature code in response to an internal command. The update latch signal generation circuit may be configured to generate an update latch signal from the temperature code in response to the update pulse. The temperature code output circuit may be configured to generate a synchronization temperature code from the command latch signal in response to an output control pulse.

DETAILED DESCRIPTION

Hereinafter, a semiconductor system will be described below with reference to the accompanying drawings through various examples of embodiments.

Various embodiments are directed to a semiconductor system including a semiconductor device that may be capable of outputting a temperature code in synchronization with a command.

According to various embodiments, by applying a synchronization temperature code synchronized with a mode register read command, a controller may stably perform a control operation by using the synchronization temperature code.

Also, according to various embodiments, in the case where a temperature code changes, a synchronization update flag which is enabled for a period required to update the synchronization temperature code may be generated and applied to the controller in synchronization with the mode register read command. Consequently, the controller may stably perform a control operation by using the synchronization updated flag.

For reference, an embodiment including additional components may be provided. Furthermore, a logic high or logic low configuration indicating a logic state of a signal may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
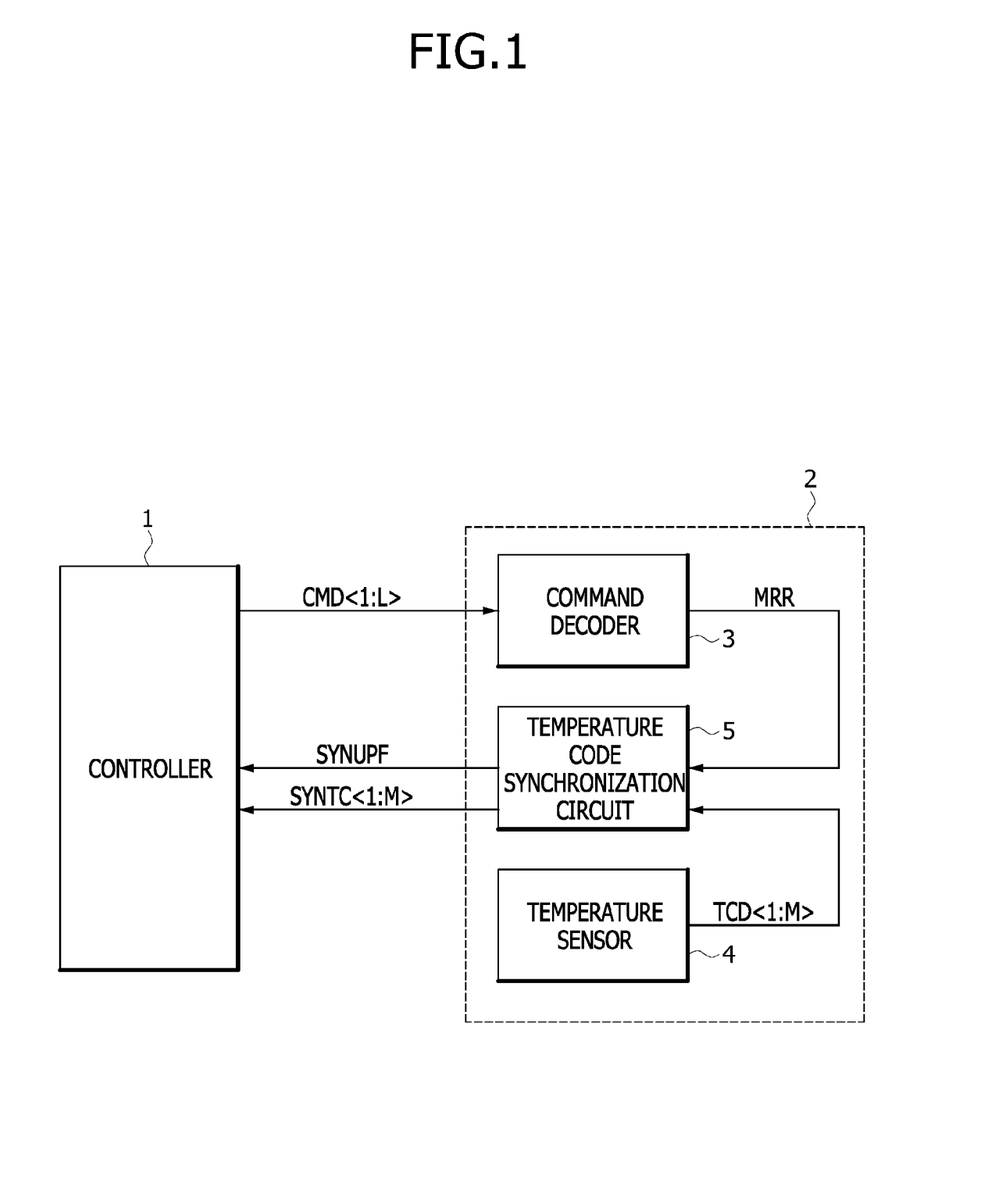
FIG. 1 is a block diagram illustrating an example of the configuration of a semiconductor system in accordance with an embodiment.

As illustrated in FIG. 1, a semiconductor system in accordance with an embodiment may include a controller 1 and a semiconductor device 2. The semiconductor device 2 may include a command decoder 3, a temperature sensor 4, and a temperature code synchronization circuit 5.

The controller 1 may apply a command CMD<1:L> to the semiconductor device 2. The number L of the bits included in the command CMD<1:L> may be set variously depending on an embodiment. The controller 1 may be applied with a synchronization update flag SYNUPF and a synchronization temperature code SYNTC<1:M> from the semiconductor device 2. The synchronization update flag SYNUPF may be enabled for a period in which the synchronization temperature code SYNTC<1:M> is updated. The synchronization temperature code SYNTC<1:M> may include updated temperature information, and may be generated in a preset operation that is entered by the command CMD<1:L>. In an embodiment, the preset operation may be set as a mode register read operation for outputting the information stored in a mode register (not illustrated).

The command decoder 3 may decode the command CMD<1:L> and generate a mode register read command MRR. The command decoder 3 may generate the mode register read command MRR in the case where the bits included in the command CMD<1:L> are inputted in a preset logic level combination. The mode register read command MRR may be generated to perform the mode register read operation. The preset logic level combination of the bits included in the command CMD<1:L>, capable of generating the mode register read command MRR, may be set variously depending on an embodiment.

The temperature sensor 4 may measure the internal temperature of the semiconductor device 2, and may generate a temperature code TCD<1:M> including bits which have a logic level combination corresponding to the measured temperature. The temperature sensor 4 may be embodied by a digital thermometer such as a TCSR (temperature-compensated self-refresh) circuit and a digital TCSR circuit. The number M of the bits included in the temperature code TCD<1:M> may be set variously depending on an embodiment.

The temperature code synchronization circuit 5 may generate the synchronization update flag SYNUPF and the synchronization temperature code SYNTC<1: M> from the temperature code TCD<1:M> in response to the mode register read command MRR. The temperature code synchronization circuit 5 may generate the synchronization update flag SYNUPF which is enabled for a period required to update the synchronization temperature code SYNTC<1:M> with a changed temperature code TCD<1:M>, in the case where the logic level combination of the temperature code TCD<1:M> changes as the internal temperature of the semiconductor device 2 changes. The temperature code synchronization circuit 5 may generate the synchronization update flag SYNUPF which is disabled, after the synchronization temperature code SYNTC<1:M> is updated with the changed temperature code TCD<1:M>. The detailed configuration and operation of the temperature code synchronization circuit 5 will be described below with reference to FIGS. 2 to 9.

Figure 2:
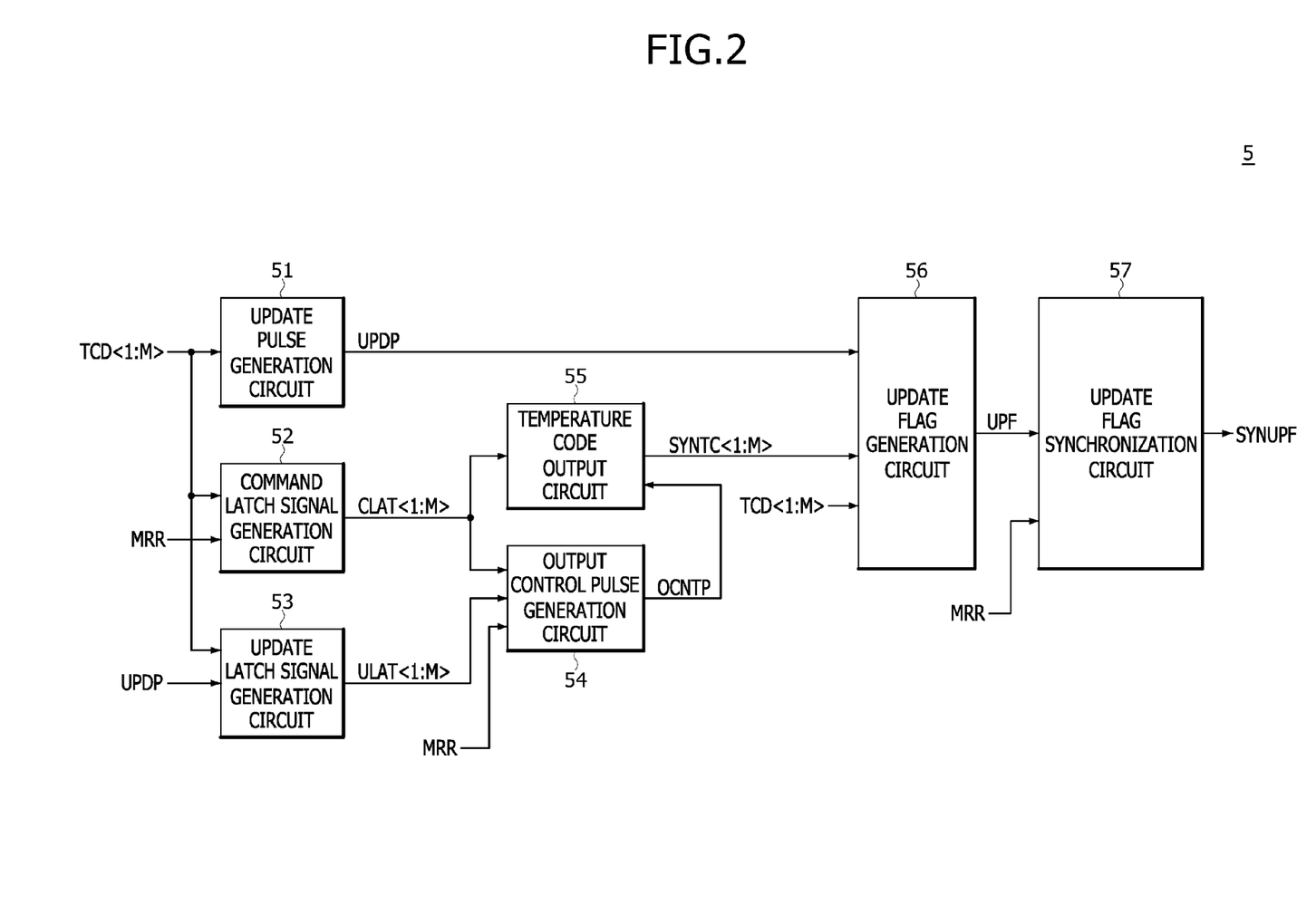
FIG. 2 is a block diagram illustrating an example of the configuration of the temperature code synchronization circuit included in the semiconductor system illustrated in FIG. 1 in accordance with an embodiment.

Referring to FIG. 2, the temperature code synchronization circuit 5 may include an update pulse generation circuit 51, a command latch signal generation circuit 52, an update latch signal generation circuit 53, an output control pulse generation circuit 54, a temperature code output circuit 55, an update flag generation circuit 56, and an update flag synchronization circuit 57.

The update pulse generation circuit 51 may generate an update pulse UPDP in response to the temperature code TCD<1:M>. The update pulse generation circuit 51 may generate the update pulse UPDP in the case where the internal temperature of the semiconductor device 2 changes and thus the logic level combination of the temperature code TCD<1:M> changes. The detailed configuration and operation of the update pulse generation circuit 51 will be described later with reference to FIG. 3.

The command latch signal generation circuit 52 may generate a command latch signal CLAT<1:M> from the temperature code TCD<1:M> in response to the mode register read command MRR. The command latch signal generation circuit 52 may latch the temperature code TCD<1:M> in the case where the mode register read command MRR is generated to perform the mode register read operation, and may output the latched temperature code TCD<1:M> as the command latch signal CLAT<1:M>. The detailed configuration and operation of the command latch signal generation circuit 52 will be described later with reference to FIG. 4.

The update latch signal generation circuit 53 may generate an update latch signal ULAT<1:M> from the temperature code TCD<1:M> in response to the update pulse UPDP. The update latch signal generation circuit 53 may latch the temperature code TCD<1:M> in the case where the update pulse UPDP is generated, and may output the latched temperature code TCD<1:M> as the update latch signal ULAT<1:M>. The detailed configuration and operation of the update latch signal generation circuit 53 will be described later with reference to FIG. 5.

The output control pulse generation circuit 54 may generate an output control pulse OCNTP from the command latch signal CLAT<1:M> and the update latch signal ULAT<1:M> in response to the mode register read command MRR. The output control pulse generation circuit 54 may generate the output control pulse OCNTP in the case where the command latch signal CLAT<1:M> and the update latch signal ULAT<1:M> are the same when the mode register read command MRR is generated to perform the mode register read operation. The detailed configuration and operation of the output control pulse generation circuit 54 will be described later with reference to FIG. 6.

The temperature code output circuit 55 may generate the synchronization temperature code SYNTC<1:M> from the command latch signal CLAT<1:M> in response to the output control pulse OCNTP. The temperature code output circuit 55 may latch the command latch signal CLAT<1:M> in the case where the output control pulse OCNTP is generated, and may output the latched command latch signal CLAT<1:M> as the synchronization temperature code SYNTC<1:M>. The detailed configuration and operation of the temperature code output circuit 55 will be described later with reference to FIG. 7.

The update flag generation circuit 56 may generate an update flag UPF in response to the update pulse UPDP, the synchronization temperature code SYNTC<1:M>, and the temperature code TCD<1:M>. The update flag generation circuit 56 may generate the update flag UPF which is enabled, in the case where the update pulse UPDP is generated. The update flag generation circuit 56 may generate the update flag UPF which is disabled, in the case where the synchronization temperature code SYNTC<1:M> and the temperature code TCD<1:M> are the same. The detailed configuration and operation of the update flag generation circuit 56 will be described later with reference to FIG. 8.

The update flag synchronization circuit 57 may generate the synchronization update flag SYNUPF from the update flag UPF in response to the mode register read command MRR. The update flag synchronization circuit 57 may latch the update flag UPF when the mode register read command MRR is generated to perform the mode register read operation, and may output the latched update flag UPF as the synchronization update flag SYNUPF. The detailed configuration and operation of the update flag synchronization circuit 57 will be described later with reference to FIG. 9.

Figure 3:
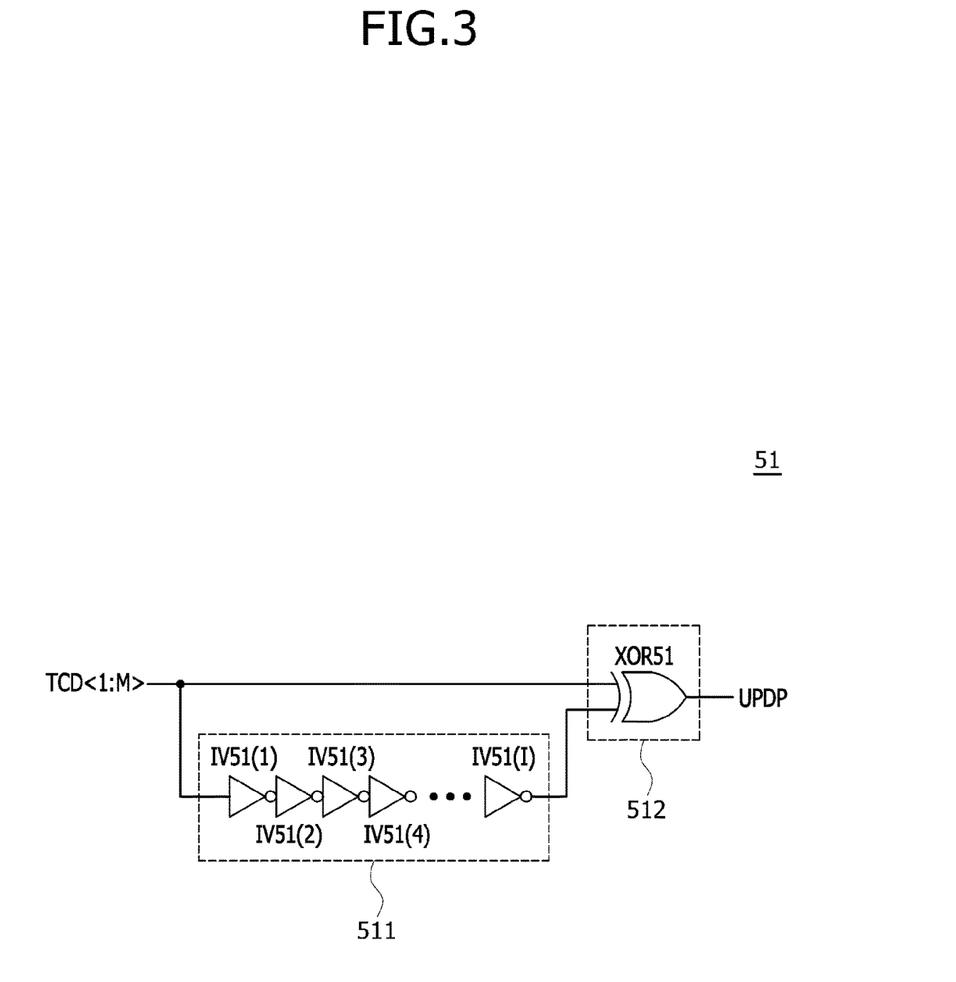
FIG. 3 is a circuit diagram illustrating an example of the update pulse generation circuit included in the temperature code synchronization circuit illustrated in FIG. 2 in accordance with an embodiment.

Referring to FIG. 3, the update pulse generation circuit 51 may include a temperature code delay 511 and an update pulse output circuit 512. The temperature code delay 511 may include inverters IV51(1:I). The temperature code delay 511 may delay the temperature code TCD<1:M> through the inverters IV51(1:I), and may output an output signal. The number I of the inverters IV51(1:I) included in the temperature code delay 511 may be set to a natural number that is an even number. The update pulse output circuit 512 may include an exclusive OR element XOR51. The exclusive OR element XOR51 may receive the temperature code TCD<1:M> and the output signal of the temperature code delay 511, and may perform an exclusive OR (XOR) logic operation. The update pulse output circuit 512 may generate the update pulse UPDP in the case where the temperature code TCD<1:M> and the output signal of the temperature code delay 511 are different. The update pulse generation circuit 51 may generate the update pulse UPDP for a delay period that is set by the inverters IV51 (1:I), in the case where the internal temperature of the semiconductor device 2 changes and thus the logic level combination of the temperature code TCD<1: M> changes.

Figure 4:
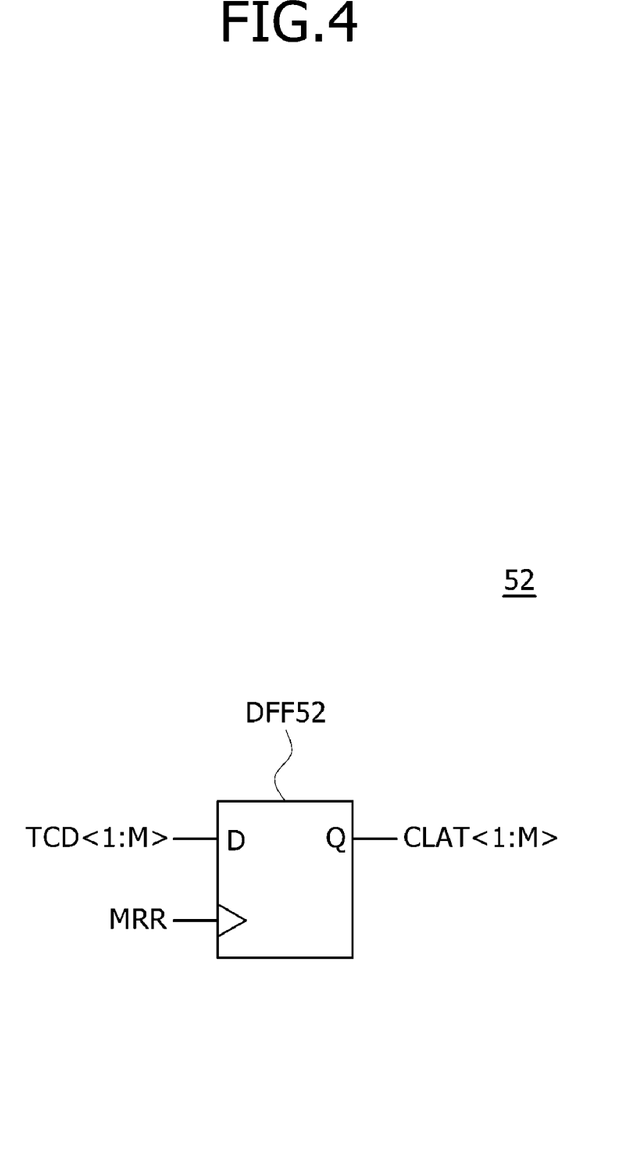
FIG. 4 is a circuit diagram illustrating an example of the command latch signal generation circuit included in the temperature code synchronization circuit illustrated in FIG. 2.

Referring to FIG. 4, the command latch signal generation circuit 52 may include a D flip-flop DFF52. The D flip-flop DFF52 may latch the temperature code TCD<1:M> in synchronization with the rising edge of the mode register read command MRR, and may output the latched temperature code TCD<1:M> as the command latch signal CLAT<1:M>.

Figure 5:
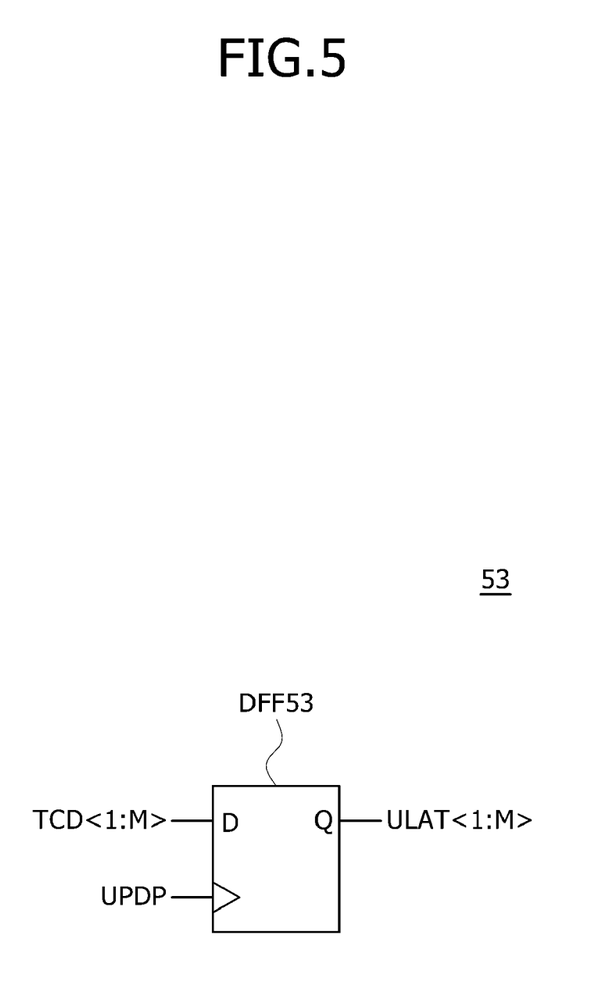
FIG. 5 is a circuit diagram illustrating an example of the update latch signal generation circuit included in the temperature code synchronization circuit illustrated in FIG. 2 in accordance with an embodiment.

Referring to FIG. 5, the update latch signal generation circuit 53 may include a D flip-flop DFF53. The D flip-flop DFF53 may latch the temperature code TCD<1:M> in synchronization with the rising edge of the update pulse UPDP, and may output the latched temperature code TCD<1:M> as the update latch signal ULAT<1:M>.

Figure 6:
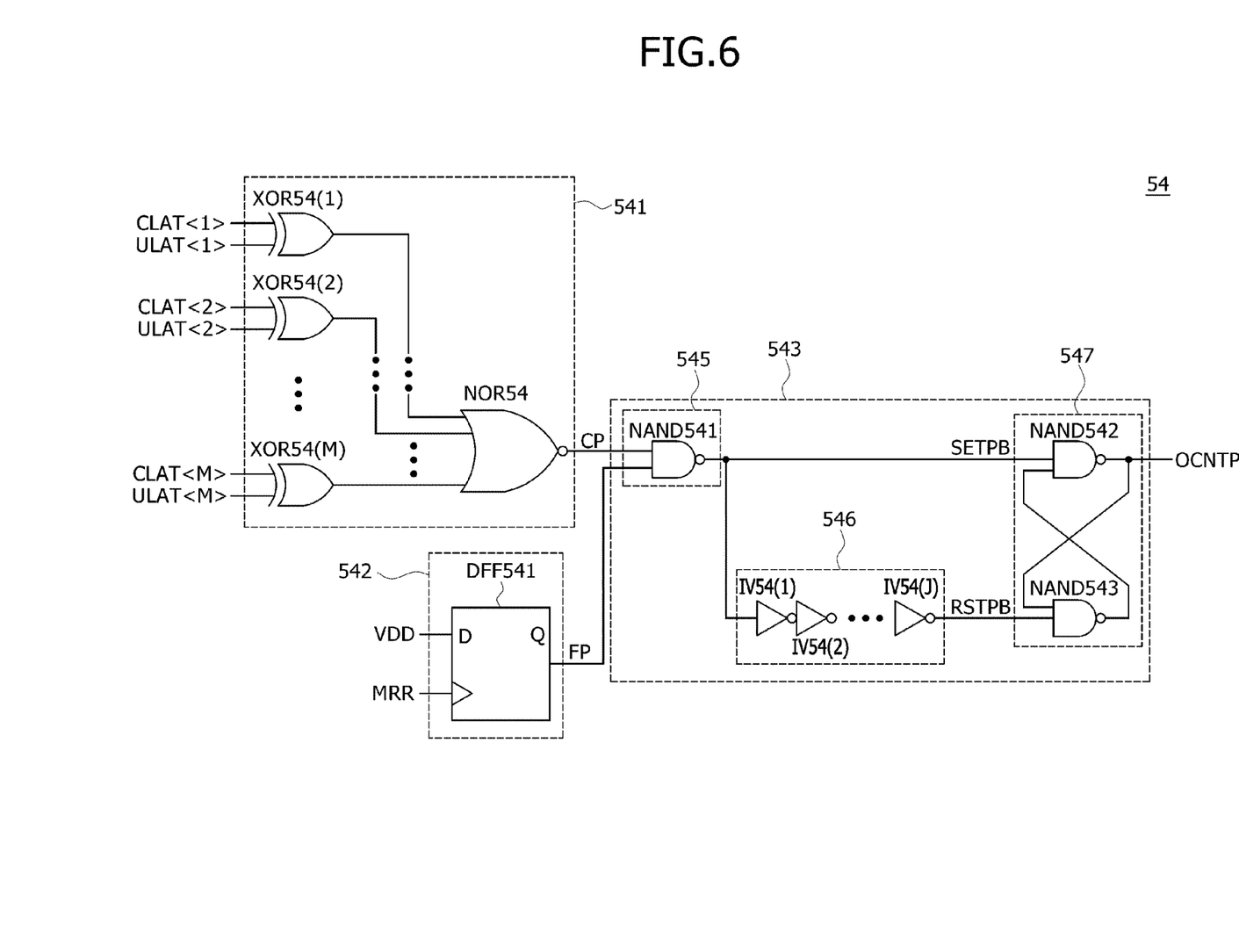
FIG. 6 is a circuit diagram illustrating an example of the output control pulse generation circuit included in the temperature code synchronization circuit illustrated in FIG. 2 in accordance with an embodiment.

Referring to FIG. 6, the output control pulse generation circuit 54 may include a comparison pulse generation circuit 541, a fixed pulse generation circuit 542, and an output control pulse output circuit 543.

The comparison pulse generation circuit 541 may include exclusive OR elements XOR54(1:M) and a NOR element NOR54. The exclusive OR element XOR54(1) may receive the first bit CLAT<1> of a command latch signal and the first bit ULAT<1> of an update latch signal, and may perform an XOR logic operation. The exclusive OR element XOR54(1) may output a logic low level in the case where the first bit CLAT<1> of the command latch signal and the first bit ULAT<1> of the update latch signal are the same. The exclusive OR element XOR54(2) may receive the second bit CLAT<2> of the command latch signal and the second bit ULAT<2> of the update latch signal, and may perform an XOR logic operation. The exclusive OR element XOR54(2) may output a logic low level in the case where the second bit CLAT<2> of the command latch signal and the second bit ULAT<2> of the update latch signal are the same. The exclusive OR element XOR54(M) may receive the M^th bit CLAT<M> of the command latch signal and the M^th bit ULAT<M> of the update latch signal, and may perform an XOR logic operation. The exclusive OR element XOR54(M) may output a logic low level in the case where the M^th bit CLAT<M> of the command latch signal and the M^th bit ULAT<M> of the update latch signal are the same. The NOR element NOR54 may generate a comparison pulse CP at a logic high level in the case where all of the output signals of the exclusive OR elements XOR54(1:M) are logic low levels.

The fixed pulse generation circuit 542 may include a D flip-flop DFF541. The D flip-flop DFF541 may latch a power supply voltage VDD in synchronization with the rising edge of the mode register read command MRR, and may output the latched power supply voltage VDD as a fixed pulse FP.

The output control pulse output circuit 543 may include a set pulse generation circuit 545, a reset pulse generation circuit 546, and an output latch circuit 547.

The set pulse generation circuit 545 may include a NAND gate NAND541. The NAND gate NAND541 may receive the comparison pulse CP and the fixed pulse FP, and perform a NAND logic operation. The set pulse generation circuit 545 may generate a set pulse SETPB which is enabled to a logic low level, in a state in which both the comparison pulse CP and the fixed pulse FP are generated at logic high levels.

The reset pulse generation circuit 546 may include inverters IV54(1:J). The reset pulse generation circuit 546 may delay the set pulse SETPB through the inverters IV54(1:J), and may output a reset pulse RSTPB. The number J of the inverters IV54(1:J) included in the reset pulse generation circuit 546 may be set to a natural number that is an even number.

The output latch circuit 547 may include NAND gates NAND542 and NAND543. The NAND gate NAND542 may receive the set pulse SETPB and the output signal of the NAND gate NAND543, perform a NAND logic operation, and output the output control pulse OCNTP. The output latch circuit 547 may generate the output control pulse OCNTP which is enabled to a logic high level, in the case where the set pulse SETPB is generated at the logic low level. The NAND gate NAND543 may receive the reset pulse RSTPB and the output signal of the NAND gate NAND542, and perform a NAND logic operation. The output latch circuit 547 may generate the output control pulse OCNTP which is disabled to a logic low level, in the case where the reset pulse RSTPB is generated at a logic low level (with set pulse SETPB generated at a logic high level). The output control pulse OCNTP may be generated for a delay period that is set by the inverters IV54(1:J).

Figure 7:
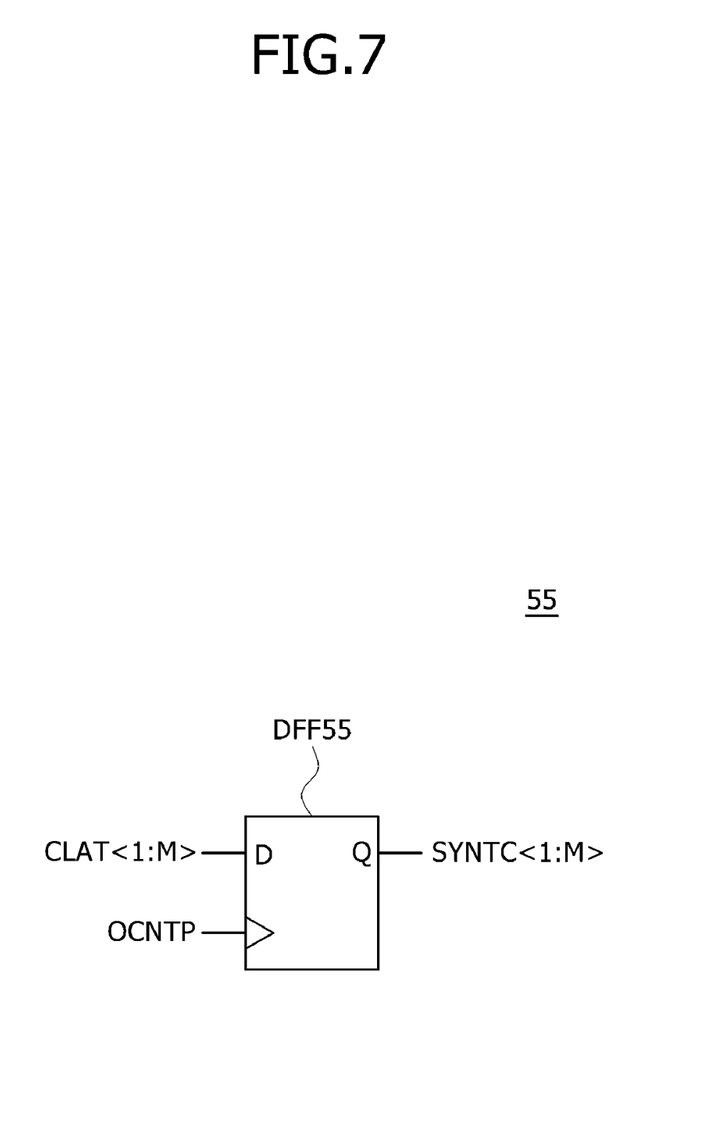
FIG. 7 is a circuit diagram illustrating an example of the temperature code output circuit included in the temperature code synchronization circuit illustrated in FIG. 2 in accordance with an embodiment.

Referring to FIG. 7, the temperature code output circuit 55 may include a D flip-flop DFF55. The D flip-flop DFF55 may latch the command latch signal CLAT<1:M> in synchronization with the rising edge of the output control pulse OCNTP, and may output the latched command latch signal CLAT<1: M> as the synchronization temperature code SYNTC<1:M>.

Figure 8:
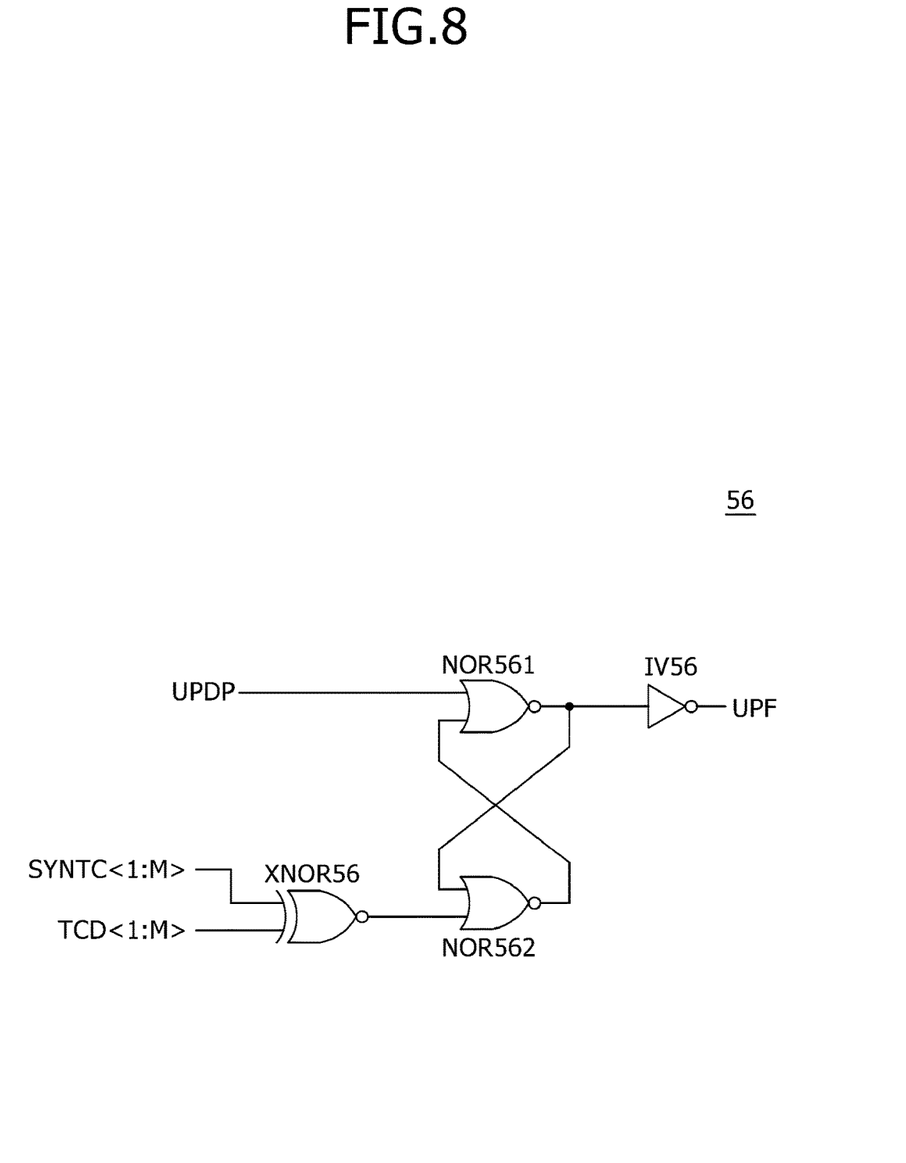
FIG. 8 is a circuit diagram illustrating an example of the update flag generation circuit included in the temperature code synchronization circuit illustrated in FIG. 2 in accordance with an embodiment.

Referring to FIG. 8, the update flag generation circuit 56 may include an exclusive NOR element XNOR56, NOR elements NOR561 and NOR562, and an inverter IV56. The NOR element NOR561 may receive the update pulse UPDP and the output signal of the NOR element NOR562, and perform a NOR logic operation. The NOR element NOR561 may output a logic low level in the case where the update pulse UPDP is generated at a logic high level. The exclusive NOR element XNOR56 may receive the synchronization temperature code SYNTC<1:M> and the temperature code TCD<1:M>, and may perform an exclusive NOR (XNOR) logic operation. The exclusive NOR element XNOR56 may output a logic high level in the case where the synchronization temperature code SYNTC<1:M> and the temperature code TCD<1:M> are the same. The NOR element NOR562 may receive the output signal of the exclusive NOR element XNOR56 and the output signal of the NOR element NOR561, and perform a NOR logic operation. The NOR element NOR562 may output a logic low level in the case where the output signal of the exclusive NOR element XNOR56 is the logic high level. The inverter IV56 may invert and buffer the output signal of the NOR element NOR561, and output the update flag UPF.

Figure 9:
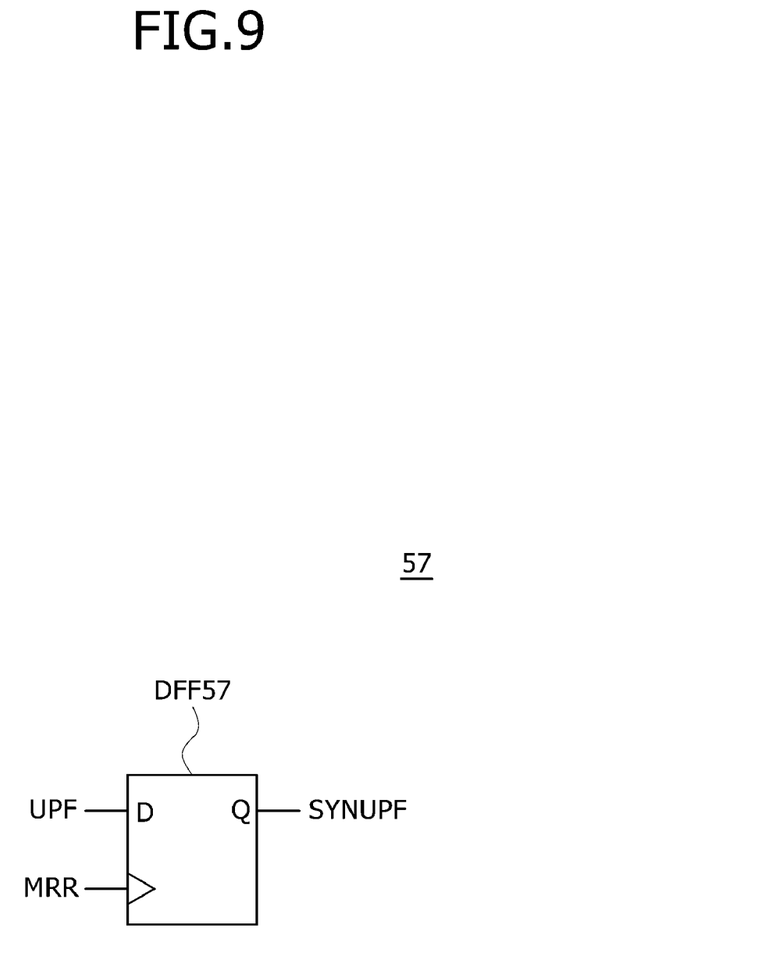
FIG. 9 is a circuit diagram illustrating an example of the update flag synchronization circuit included in the temperature code synchronization circuit illustrated in FIG. 2 in accordance with an embodiment.

Referring to FIG. 9, the update flag synchronization circuit 57 may include a D flip-flop DFF57. The D flip-flop DFF57 may latch the update flag UPF in synchronization with the rising edge of the mode register read command MRR, and may output the latched update flag UPF as the synchronization update flag SYNUPF.

The operation of the semiconductor system illustrated in FIGS. 1 to 9 will be described below with reference to FIG. 10.

Figure 10:
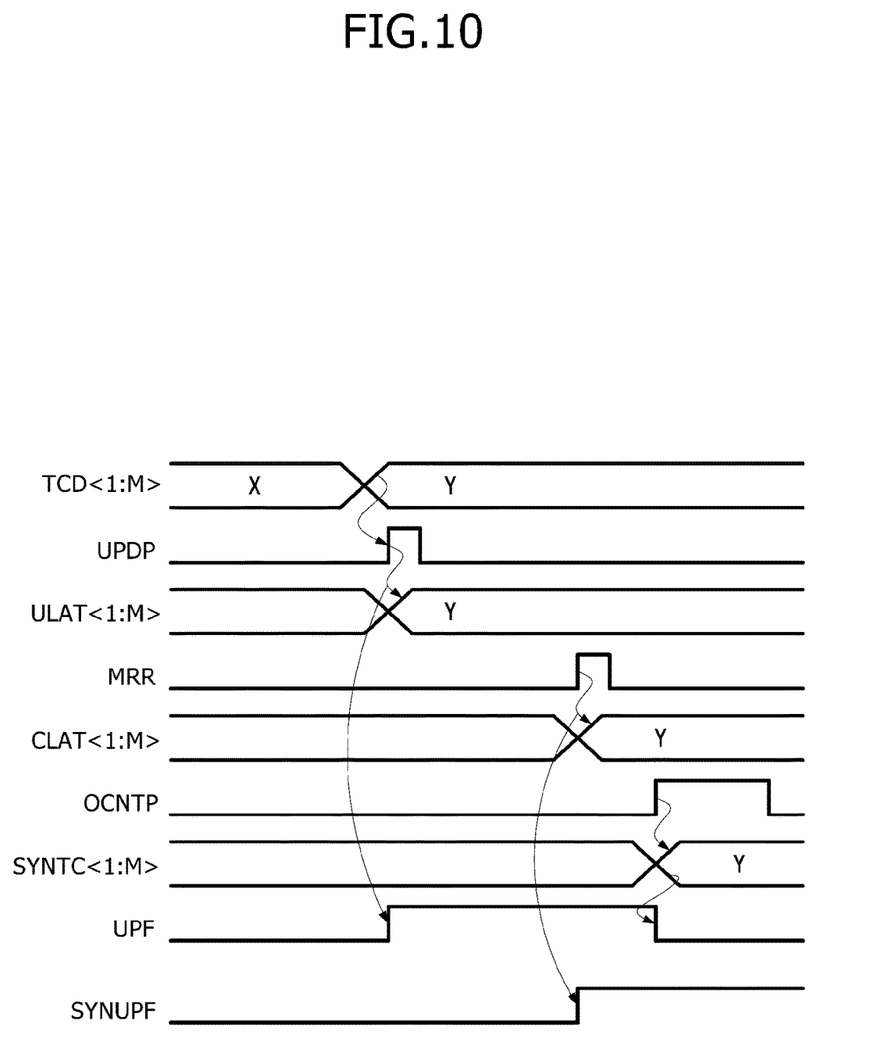
FIG. 10 illustrates an example of a timing diagram to assist in the explanation of the operation of the semiconductor system illustrated in FIGS. 1 to 9 in accordance with an embodiment.

As illustrated in FIG. 10, in the case where the internal temperature of the semiconductor device 2 changes and thus the logic level combination of the temperature code TCD<1:M> changes from 'X' to 'Y,' the update pulse UPDP may be generated. The temperature code TCD<1:M> may be latched in synchronization with a time when the update pulse UPDP is generated, and the latched temperature code TCD<1:M> may be outputted as the update latch signal ULAT<1:M>. The temperature code TCD<1:M> may be latched in synchronization with a time when the mode register read command MRR is generated to perform the mode register read operation, and the latched temperature code TCD<1:M> may be outputted as the command latch signal CLAT<1:M>. In the case where both the update latch signal ULAT<1:M> and the command latch signal CLAT<1: M> are the same by being set to the logic level combination of 'Y,' the output control pulse OCNTP may be generated. The command latch signal CLAT<1:M> may be latched in synchronization with a time when the output control pulse OCNTP is generated, and the latched command latch signal CLAT<1:M> may be outputted as the synchronization temperature code SYNTC<1:M>. The update flag UPF may be enabled to a logic high level in the case where the update pulse UPDP is generated. The update flag UPF may be disabled to a logic low level in the case where both the synchronization temperature code SYNTC<1:M> and the temperature code TCD<1:M> are the same by being set to the logic level combination of 'Y.' The update flag UPF may be outputted as the synchronization update flag SYNUPF in synchronization with a time when the mode register read command MRR is generated.

In the semiconductor system configured as mentioned above, by applying the synchronization temperature code SYNTC<1:M> synchronized with the mode register read command MRR, to the controller 1, the controller 1 may stably perform a control operation by using the synchronization temperature code SYNTC<1:M>. Also, in the semiconductor system in accordance with an embodiment, in the case where the temperature code TCD<1:M> changes, the synchronization update flag SYNUPF which is enabled for a period required to update the synchronization temperature code SYNTC<1:M> may be generated, and the synchronization update flag SYNUPF may be applied to the controller 1 in synchronization with the mode register read command MRR. Consequently, the controller 1 may stably perform a control operation by using the synchronization update flag SYNUPF.

Figure 11:
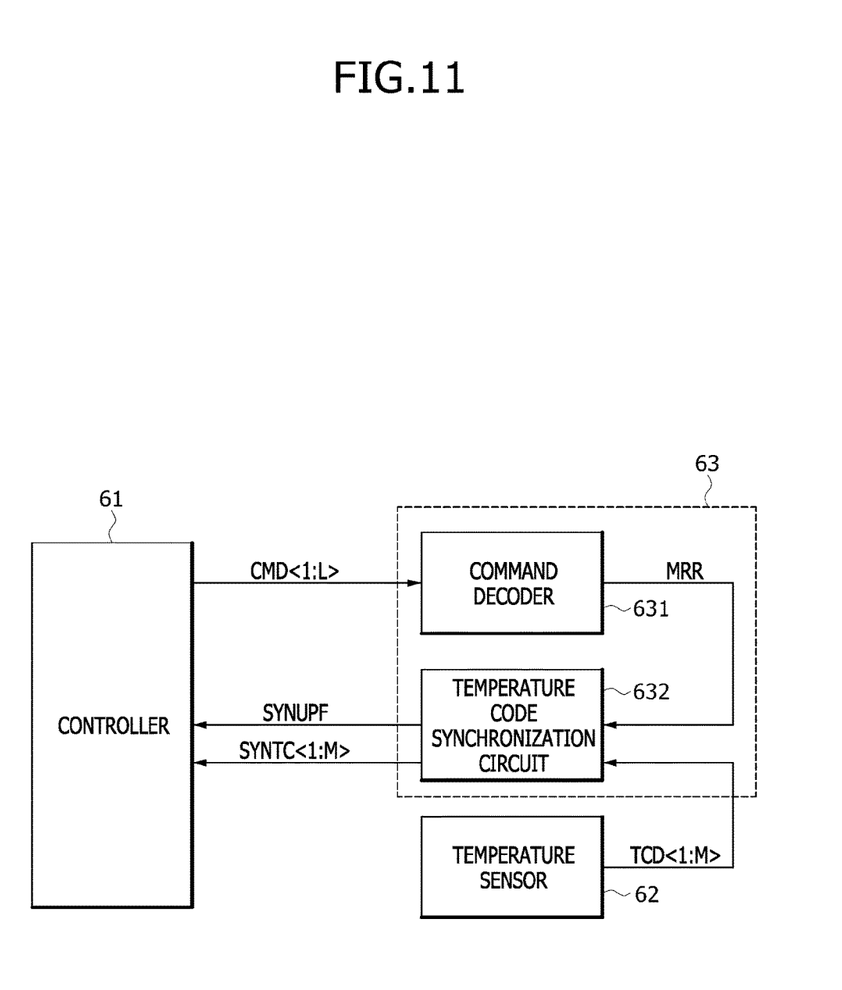
FIG. 11 is a block diagram illustrating an example of the configuration of a semiconductor system in accordance with another embodiment.

As illustrated in FIG. 11, a semiconductor system in accordance with another embodiment may include a controller 61, a temperature sensor 62, and a semiconductor device 63. The semiconductor device 63 may include a command decoder 631 and a temperature code synchronization circuit 632.

The controller 61 may apply a command CMD<1:L> to the semiconductor device 63. The number L of the bits included in the command CMD<1:L> may be set variously depending on an embodiment. The controller 61 may be applied with a synchronization update flag SYNUPF and a synchronization temperature code SYNTC<1:M> from the semiconductor device 63. The synchronization update flag SYNUPF may be enabled for a period in which the synchronization temperature code SYNTC<1: M> is updated. The synchronization temperature code SYNTC<1:M> may include updated temperature information, and may be generated in a preset operation that is entered by the command CMD<1:L>. In an embodiment, the preset operation may be set as a mode register read operation.

The temperature sensor 62 may measure the temperature of a region around the semiconductor device 63, and may generate a temperature code TCD<1:M> including bits which have a logic level combination corresponding to the measured temperature. The temperature sensor 62 may be embodied by a digital thermometer such as a TCSR (temperature-compensated self-refresh) circuit and a digital TCSR circuit. The number M of the bits included in the temperature code TCD<1:M> may be set variously depending on an embodiment.

The command decoder 631 may decode the command CMD<1:L> and generate a mode register read command MRR. The command decoder 631 may generate the mode register read command MRR in the case where the bits included in the command CMD<1:L> are inputted in a preset logic level combination. The mode register read command MRR may be generated to perform the mode register read operation. The preset logic level combination of the bits included in the command CMD<1:L>, capable of generating the mode register read command MRR, may be set variously depending on an embodiment.

The temperature code synchronization circuit 632 may generate the synchronization update flag SYNUPF and the synchronization temperature code SYNTC<1:M> from the temperature code TCD<1:M> in response to the mode register read command MRR. The temperature code synchronization circuit 632 may generate the synchronization update flag SYNUPF which is enabled for a period required to update the synchronization temperature code SYNTC<1:M> with a changed temperature code TCD<1:M>, in the case where the logic level combination of the temperature code TCD<1:M> changes. The temperature code synchronization circuit 632 may generate the synchronization update flag SYNUPF which is disabled, after the synchronization temperature code SYNTC<1:M> is updated with the changed temperature code TCD<1:M>.

The semiconductor system described above with reference to FIGS. 1 to 11 may be applied to an electronic system which includes a memory system, a graphic system, a computing system, or a mobile system. For example, referring to FIG. 12, an electronic system 1000 in accordance with an embodiment may include a data storage 1001, a memory controller 1002, a buffer memory 1003, and an input/output (I/O) interface 1004.

Figure 12:
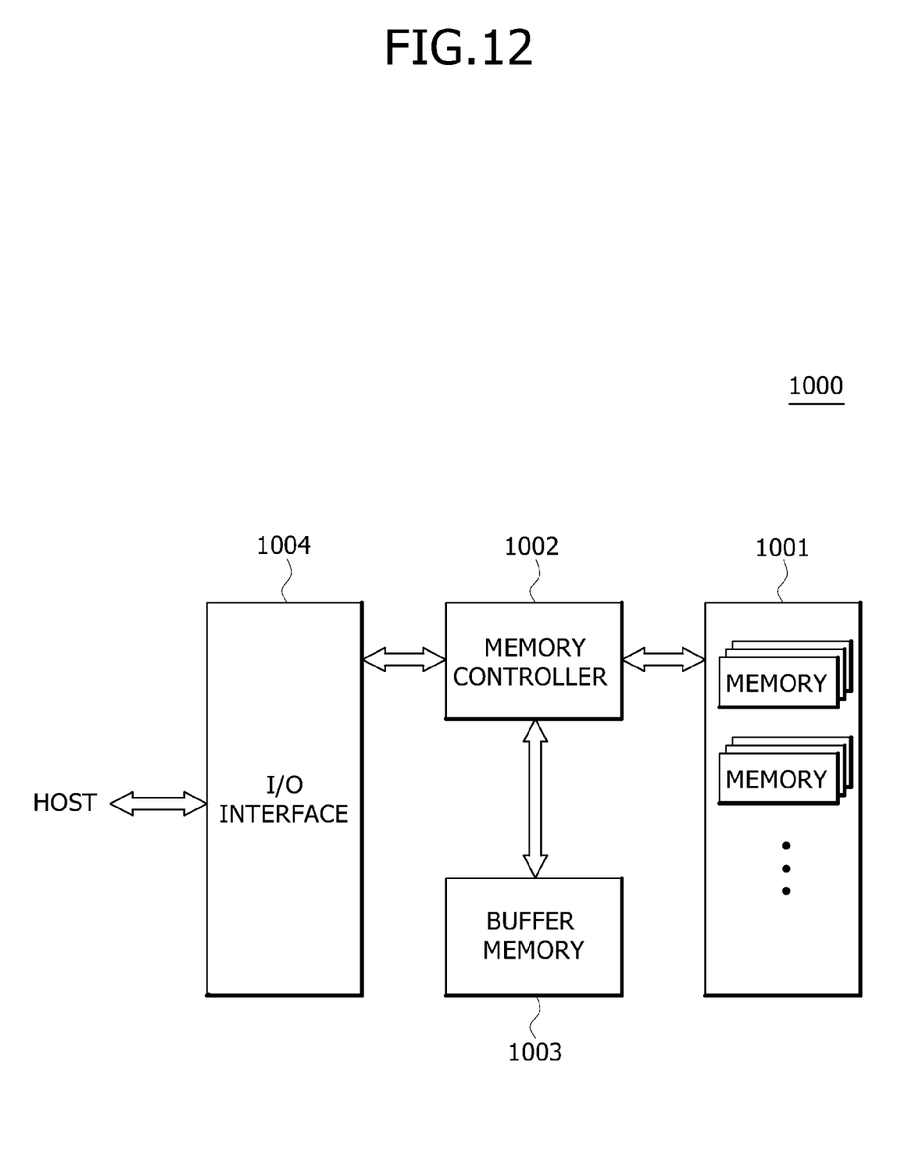
FIG. 12 is a diagram illustrating an example of the configuration of an electronic system to which each of the semiconductor systems illustrated in FIGS. 1 and 11 is applied in accordance with an embodiment.

The data storage 1001 may store data applied from the memory controller 1002, and may read out stored data and output the read-out data to the memory controller 1002, according to control signals from the memory controller 1002. The data storage 1001 may include the semiconductor device 2 illustrated in FIG. 1 or the semiconductor device 63 illustrated in FIG. 11. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), a magnetic random access memory (MRAM), etc.

The memory controller 1002 may decode commands applied through the input/output interface 1004 from an external device (a host), and may control input/output of data with respect to the data storage 1001 and the buffer memory 1003 according to decoding results. The memory controller 1002 may include the controller 1 illustrated in FIG. 1 or the controller 61 illustrated in FIG. 11. While the memory controller 1002 is illustrated as one block in FIG. 12, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 may read out stored data and output the read-out data to the memory controller 1002. The buffer memory 1003 may include a volatile memory such as a DRAM (dynamic random access memory), a mobile DRAM, and an SRAM (static random access memory).

The input/output interface 1004 may provide a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI, IDE, etc.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), a compact flash (CF) card, etc.

While various embodiments have been described above, it will be understood to those skilled in the art that the embodiments described are by way of example only. Accordingly, the semiconductor system described herein should not be limited based on the described embodiments.

What is claimed is:

1. A semiconductor system comprising:
   a controller configured to output a command; and
   a semiconductor device configured to receive and decode the command and generate an internal command to perform a preset operation, update a synchronization temperature code with a temperature code when the temperature code changes, and apply the synchronization temperature code to the controller in synchronization with the internal command.

2. The semiconductor system according to claim 1, wherein the preset operation is set as a mode register read operation, and the internal command is set as a mode register read command.

3. The semiconductor system according to claim 1, wherein the temperature code has a logic level combination which corresponds to an internal temperature of the semiconductor device.

4. The semiconductor system according to claim 1, wherein the semiconductor device is further configured to generate a synchronization update flag which is enabled for a period in which the synchronization temperature code is updated, and apply the synchronization update flag to the controller in synchronization with the internal command.

5. The semiconductor system according to claim 4, wherein the semiconductor device comprises:
   an update pulse generation circuit configured to generate an update pulse when the temperature code changes.

6. The semiconductor system according to claim 5, wherein the semiconductor device further comprises:
   a command latch signal generation circuit configured to generate a command latch signal from the temperature code in response to the internal command;
   an update latch signal generation circuit configured to generate an update latch signal from the temperature code in response to the update pulse; and
   a temperature code output circuit configured to generate the synchronization temperature code from the command latch signal in response to an output control pulse.

7. The semiconductor system according to claim 6, wherein the command latch signal generation circuit latches the temperature code when the internal command is generated, and outputs the latched temperature code as the command latch signal.

8. The semiconductor system according to claim 6, wherein the update latch signal generation circuit latches the temperature code when the update pulse is generated, and outputs the latched temperature code as the update latch signal.

9. The semiconductor system according to claim 6, wherein the temperature code output circuit outputs the command latch signal as the synchronization temperature code when the output control pulse is generated.

10. The semiconductor system according to claim 6, wherein the semiconductor device further comprises:
an output control pulse generation circuit configured to generate the output control pulse based on a comparison between the command latch signal and the update latch signal.

11. The semiconductor system according to claim 10, wherein the output control pulse generation circuit generates the output control pulse when the command latch signal and the update latch signal are the same.

12. The semiconductor system according to claim 6, wherein the semiconductor device further comprises:
an update flag generation circuit configured to generate an update flag in response to the update pulse, the synchronization temperature code, and the temperature code.

13. The semiconductor system according to claim 12, wherein the update flag generation circuit generates the update flag which is enabled when the update pulse is generated, and generates the update flag which is disabled when the synchronization temperature code and the temperature code are the same.

14. The semiconductor system according to claim 12, wherein the semiconductor device further comprises:
an update flag synchronization circuit configured to output the update flag as the synchronization update flag when the internal command is generated.

15. A semiconductor system comprising:
a controller;
a semiconductor device configured to update a synchronization temperature code with a temperature code when the temperature code changes, and apply the synchronization temperature code to the controller in synchronization with an internal command; and
a temperature sensor configured to generate the temperature code which corresponds to a temperature of a region around the semiconductor device.

16. The semiconductor system according to claim 15, wherein the semiconductor device comprises:
a command decoder configured to receive and decode a command outputted by the controller, and generate the internal command to perform a preset operation.

17. The semiconductor system according to claim 15, wherein the semiconductor device comprises:
an update pulse generation circuit configured to generate an update pulse when the temperature code changes;
a command latch signal generation circuit configured to generate a command latch signal from the temperature code in response to the internal command;
an update latch signal generation circuit configured to generate an update latch signal from the temperature code in response to the update pulse; and
a temperature code output circuit configured to generate the synchronization temperature code from the command latch signal in response to an output control pulse.

18. The semiconductor system according to claim 15, wherein the semiconductor device is further configured to generate a synchronization update flag which is enabled for a period in which the synchronization temperature code is updated, and apply the synchronization update flag to the controller in synchronization with the internal command.

19. A semiconductor device comprising:
an update pulse generation circuit configured to generate an update pulse when a temperature code changes;
a command latch signal generation circuit configured to generate a command latch signal from the temperature code in response to an internal command;
an update latch signal generation circuit configured to generate an update latch signal from the temperature code in response to the update pulse; and
a temperature code output circuit configured to generate a synchronization temperature code from the command latch signal in response to an output control pulse.

20. The semiconductor device according to claim 19, further comprising:
a command decoder configured to receive and decode a command, and generate the internal command to perform a preset operation.

21. The semiconductor device according to claim 20, wherein the preset operation is set as a mode register read operation, and the internal command is set as a mode register read command.

22. The semiconductor device according to claim 19, further comprising:
an output control pulse generation circuit configured to generate the output control pulse based on a comparison between the command latch signal and the update latch signal.

23. The semiconductor device according to claim 22, wherein the output control pulse generation circuit generates the output control pulse when the command latch signal and the update latch signal are the same.

24. The semiconductor device according to claim 19, further comprising:
an update flag generation circuit configured to generate an update flag which is enabled when the update pulse is generated, and generate the update flag which is disabled when the synchronization temperature code and the temperature code are the same.

25. The semiconductor device according to claim 20, further comprising:
an update flag synchronization circuit configured to output the update flag as a synchronization update flag when the internal command is generated.

* * * * *